(12) United States Patent
Chen et al.

(10) Patent No.: US 12,176,403 B2
(45) Date of Patent: Dec. 24, 2024

(54) HIGH ELECTRON MOBILITY TRANSISTOR DEVICE

(71) Applicant: United Microelectronics Corp., Hsinchu (TW)

(72) Inventors: Chi-Hsiao Chen, Chiayi (TW); Tzyy-Ming Cheng, Hsinchu (TW); Wei Jen Chen, Tainan (TW); Kai Lin Lee, Kinmen County (TW)

(73) Assignee: United Microelectronics Corp., Hsinchu (TW)

( * ) Notice: Subject to any disclaimer, the term of this patent is extended or adjusted under 35 U.S.C. 154(b) by 391 days.

(21) Appl. No.: 17/737,041

(22) Filed: May 5, 2022

(65) Prior Publication Data

US 2023/0326980 A1    Oct. 12, 2023

(30) Foreign Application Priority Data

Apr. 11, 2022    (CN) .......................... 202210374281.1

(51) Int. Cl.
| | |
|---|---|
| *H01L 29/40* | (2006.01) |
| *H01L 29/417* | (2006.01) |
| *H01L 29/423* | (2006.01) |
| *H01L 29/778* | (2006.01) |

(52) U.S. Cl.
CPC ...... *H01L 29/402* (2013.01); *H01L 29/41775* (2013.01); *H01L 29/42316* (2013.01); *H01L 29/7786* (2013.01)

(58) Field of Classification Search
CPC ............. H01L 29/402; H01L 29/41775; H01L 29/42316; H01L 29/7786; H01L 29/404; H01L 29/1066; H01L 29/2003
See application file for complete search history.

(56) References Cited

U.S. PATENT DOCUMENTS

| | | | |
|---|---|---|---|
| 10,263,103 B2 | 4/2019 | Makiyama | |
| 11,749,726 B2* | 9/2023 | Bothe | .................... H01L 29/404 |
| | | | 257/76 |
| 2020/0312968 A1* | 10/2020 | Kasahara | .............. H01L 29/778 |
| 2021/0265477 A1* | 8/2021 | Lu | .......................... H01L 29/778 |
| 2022/0130965 A1* | 4/2022 | Bothe | ................. H01L 29/2003 |
| 2022/0416031 A1* | 12/2022 | Yoshitsugu | ......... H01L 29/2003 |

* cited by examiner

*Primary Examiner* — J. E. Schoenholtz
(74) *Attorney, Agent, or Firm* — JCIPRNET (57) ABSTRACT

A high electron mobility transistor (HEMT) device including the following components is provided. A gate electrode is located on a barrier layer. A source electrode is located on the first side of the gate electrode. A drain electrode is located on the second side of the gate. A source field plate is connected to the source electrode. The source field plate includes first, second, and third field plate portions. The first field plate portion is connected to the source electrode and is located on the first side of the gate electrode. The second field plate portion is located on the second side of the gate electrode. The third field plate portion is connected to the end of the first field plate portion and the end of the second field plate portion. The source field plate has a first opening located directly above the gate electrode.

19 Claims, 14 Drawing Sheets

HIGH ELECTRON MOBILITY TRANSISTOR DEVICE

CROSS-REFERENCE TO RELATED APPLICATION

This application claims the priority benefit of China patent application serial no. 202210374281.1, filed on Apr. 11, 2022. The entirety of the above-mentioned patent application is hereby incorporated by reference herein and made a part of this specification.

BACKGROUND OF THE INVENTION

Field of the Invention

The invention relates to a semiconductor device, and particularly relates to a high electron mobility transistor (HEMT) device.

Description of Related Art

The current HEMT device uses a source field plate to adjust the electric field to improve the electrical performance of the device. However, parasitic capacitance is generated between the source field plate and the gate electrode, resulting in power loss and a reduction in device speed.

SUMMARY OF THE INVENTION

The invention provides a HEMT device, which can reduce power loss and improve device speed.

The invention provides a HEMT device, which includes a substrate, a channel layer, a barrier layer, a gate electrode, a source electrode, a drain electrode, and a source field plate. The channel layer is located on the substrate. The barrier layer is located on the channel layer. The gate electrode is located on the barrier layer and has a first side and a second side opposite to each other. The source electrode is located on the first side of the gate electrode. The drain electrode is located on the second side of the gate electrode. The source field plate is connected to the source electrode. The source field plate includes a first field plate portion, a second field plate portion, and a third field plate portion. The first field plate portion is connected to the source electrode and is located on the first side of the gate electrode. The second field plate portion is located on the second side of the gate electrode. The third field plate portion is connected to the end of the first field plate portion and the end of the second field plate portion. The source field plate has a first opening located directly above the gate electrode. The first opening is located between the first field plate portion and the second field plate portion. The top-view pattern of the third field plate portion partially overlaps the top-view pattern of the gate electrode.

According to an embodiment of the invention, in the HEMT device, the top-view pattern of the first field plate portion may not overlap the top-view pattern of the gate electrode.

According to an embodiment of the invention, in the HEMT device, the top-view pattern of the second field plate portion may not overlap the top-view pattern of the gate electrode.

According to an embodiment of the invention, in the HEMT device, the first field plate portion may extend in a first direction away from the third field plate portion. The second field plate portion may extend in a second direction away from the third field plate portion.

According to an embodiment of the invention, in the HEMT device, the second field plate portion may have at least one second opening.

According to an embodiment of the invention, in the HEMT device, the top surface of the gate electrode may have two protrusion portions.

According to an embodiment of the invention, in the HEMT device, the bottom surface of the third field plate portion may have two recess portions corresponding to the two protrusion portions.

According to an embodiment of the invention, the HEMT device may further include a passivation layer. The passivation layer is located between the source field plate and the gate electrode.

According to an embodiment of the invention, the HEMT device may further include a buffer layer and a nucleation layer. The buffer layer is located between the channel layer and the substrate. The nucleation layer is located between the buffer layer and the substrate.

According to an embodiment of the invention, the HEMT device may further include a p-type gallium nitride (GaN) layer. The p-type GaN layer is located between the gate electrode and the barrier layer.

The invention provides another a HEMT device, which includes a substrate, a channel layer, a barrier layer, a gate electrode, a source electrode, a drain electrode, and a source field plate. The channel layer is located on the substrate. The barrier layer is located on the channel layer. The gate electrode is located on the barrier layer and has a first side and a second side opposite to each other. The source electrode is located on the first side of the gate electrode. The drain electrode is located on the second side of the gate electrode. The source field plate is connected to the source electrode. The source field plate includes a first field plate portion, a second field plate portion, and a third field plate portion. The first field plate portion is connected to the source electrode and is located on the first side of the gate electrode. The second field plate portion is located on the second side of the gate electrode. The third field plate portion is connected to the end of the first field plate portion and the end of the second field plate portion. The source field plate has a first opening located directly above the gate electrode. The first opening is located between the first field plate portion and the second field plate portion. The top-view pattern of the third field plate portion does not overlap the top-view pattern of the gate electrode.

According to another embodiment of the invention, in the HEMT device, the top-view pattern of the first field plate portion may not overlap the top-view pattern of the gate electrode.

According to another embodiment of the invention, in the HEMT device, the top-view pattern of the second field plate portion may not overlap the top-view pattern of the gate electrode.

According to another embodiment of the invention, in the HEMT device, the first field plate portion may extend in a first direction away from the third field plate portion. The second field plate portion may extend in a second direction away from the third field plate portion.

According to another embodiment of the invention, in the HEMT device, the second field plate portion may have at least one second opening.

According to another embodiment of the invention, in the HEMT device, the top surface of the gate electrode may have two protrusion portions.

According to another embodiment of the invention, in the HEMT device, the bottom surface of the third field plate portion may have two recess portions corresponding to the two protrusion portions.

According to another embodiment of the invention, the HEMT device may further include a passivation layer. The passivation layer is located between the source field plate and the gate electrode.

According to another embodiment of the invention, the HEMT device may further include a buffer layer and a nucleation layer. The buffer layer is located between the channel layer and the substrate. The nucleation layer is located between the buffer layer and the substrate.

According to another embodiment of the invention, the HEMT device may further include a p-type GaN layer. The p-type GaN layer is located between the gate electrode and the barrier layer.

Based on the above description, in the HEMT device according to the invention, the source field plate includes the first field plate portion, the second field plate portion, and the third field plate portion, and the third field plate portion is connected to the end of the first field plate portion and the end of the second field plate portion. In addition, the source field plate has the first opening located directly above the gate electrode, and the first opening is located between the first field plate portion and the second field plate portion. Therefore, the overlapping area of the source field plate and the gate electrode can be reduced to reduce the parasitic capacitance between the source field plate and the gate electrode, thereby reducing power loss and improving device speed.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 1A:
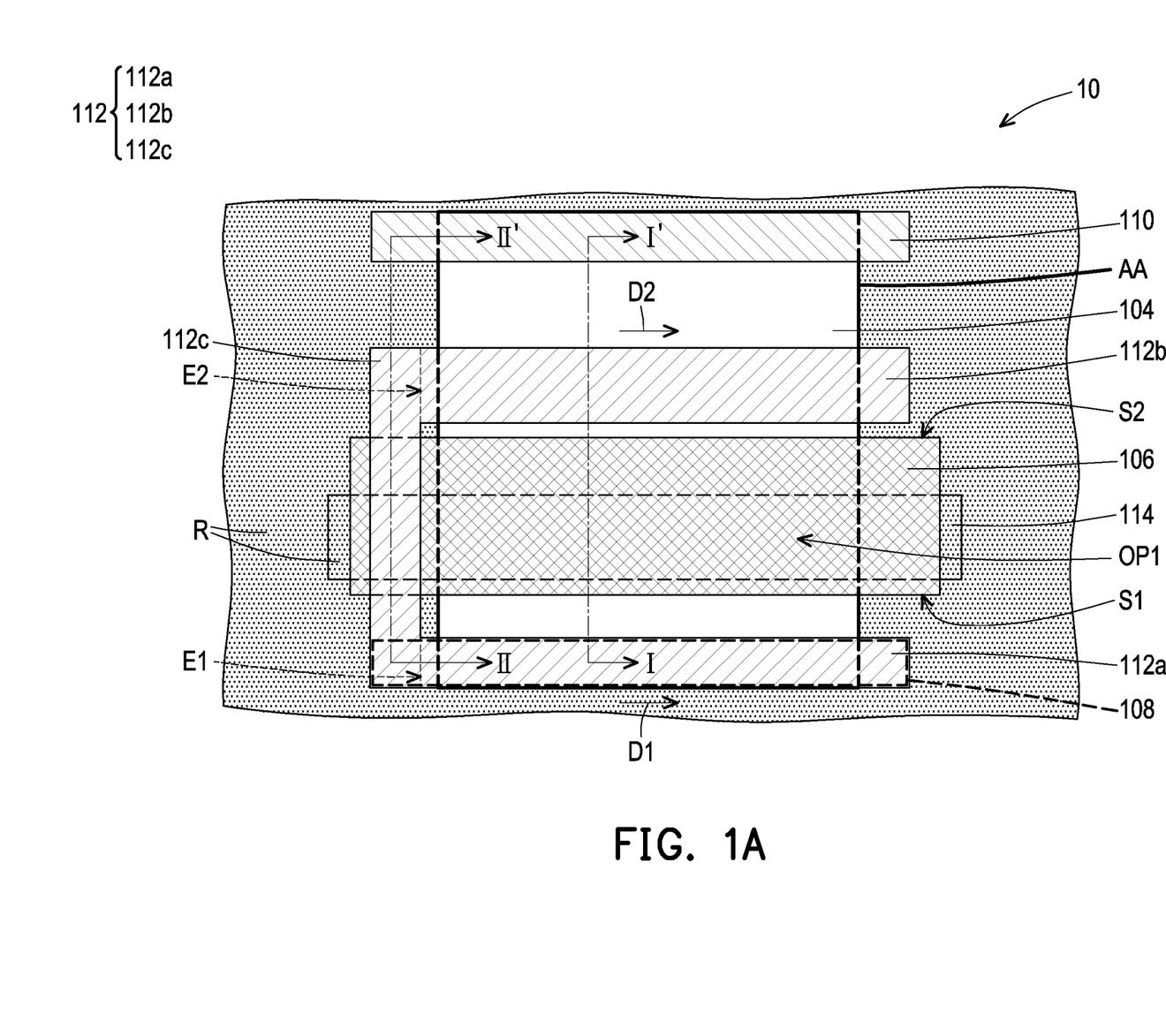
FIG. 1A is a top view illustrating a HEMT device according to some embodiments of the invention.
Figure 1B:
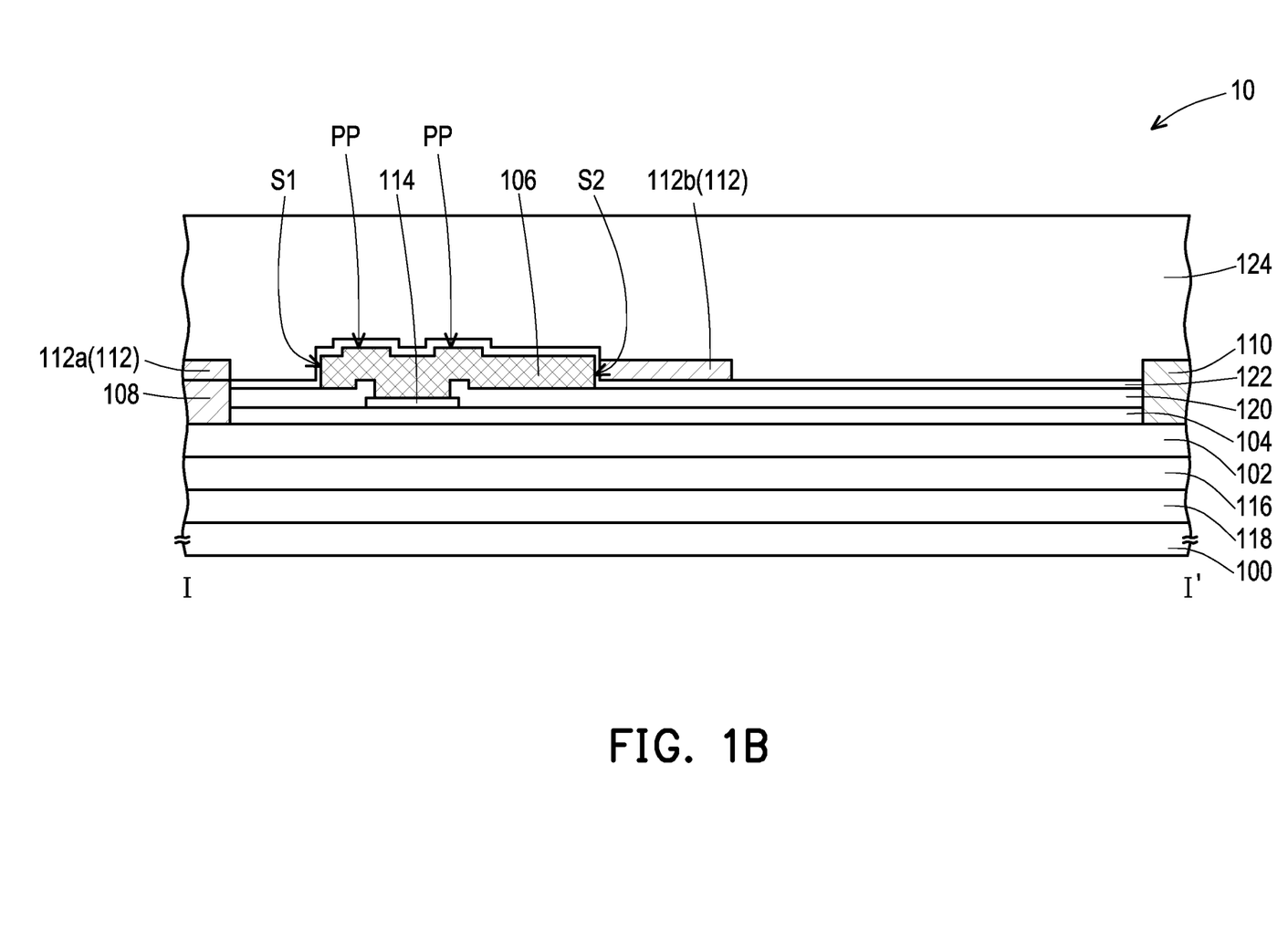
FIG. 1B is a cross-sectional view taken along section line I-I' in FIG. 1A.
Figure 1C:
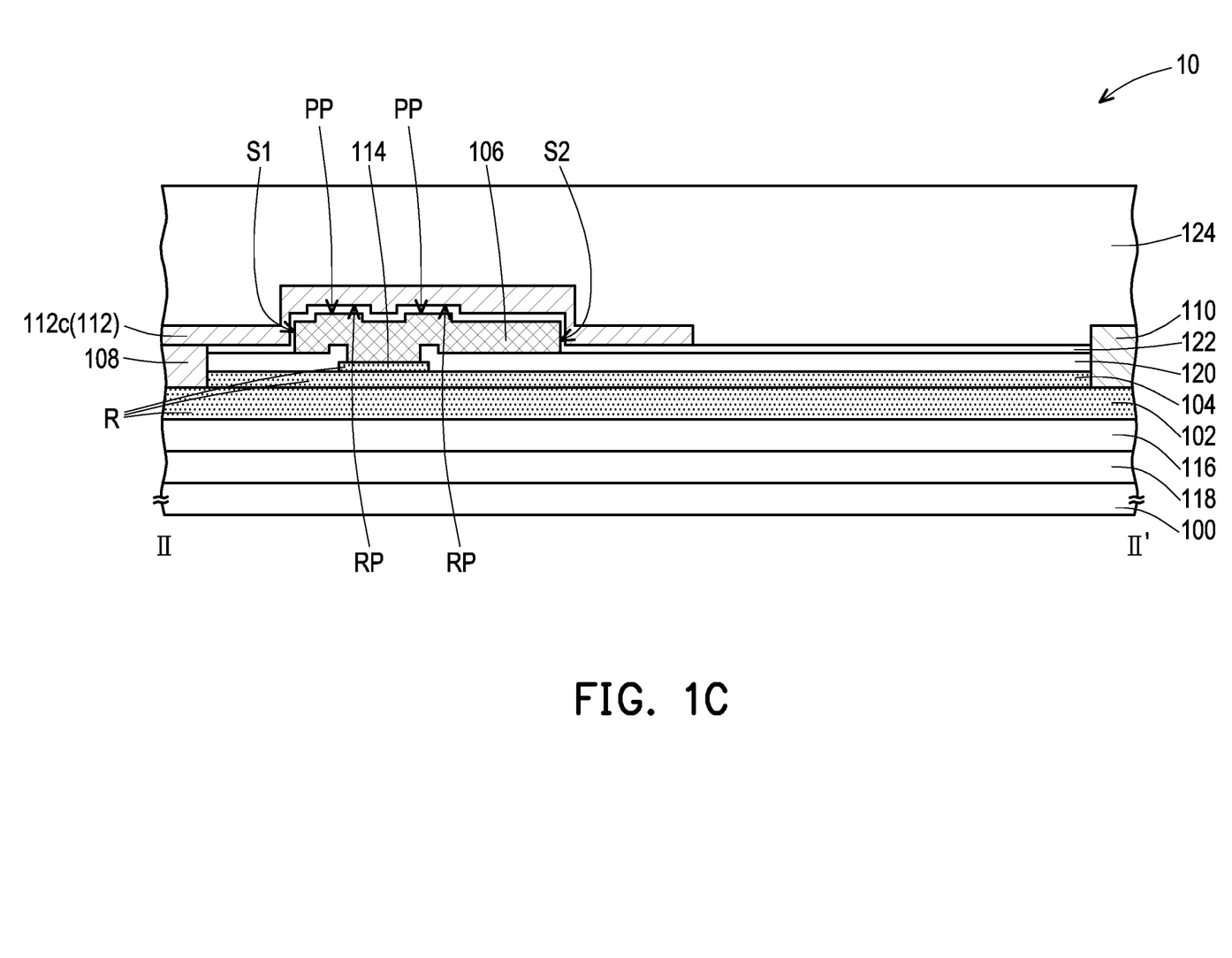
FIG. 1C is a cross-sectional view taken along section line II-II' in FIG. 1A.
Figure 2A:
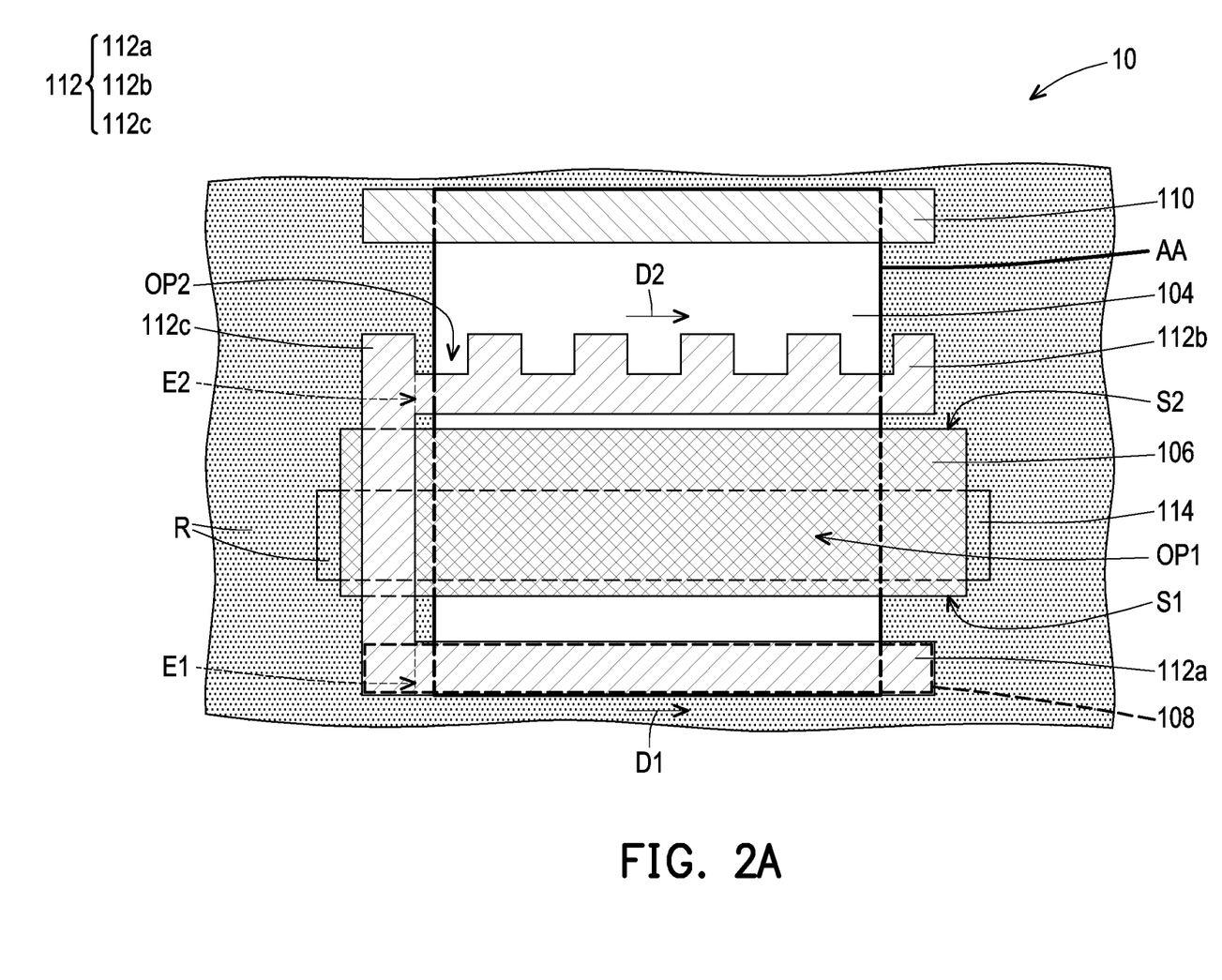
FIG. 2A to FIG. 2D are top views illustrating a HEMT device according to other embodiments of the invention.
Figure 2B:
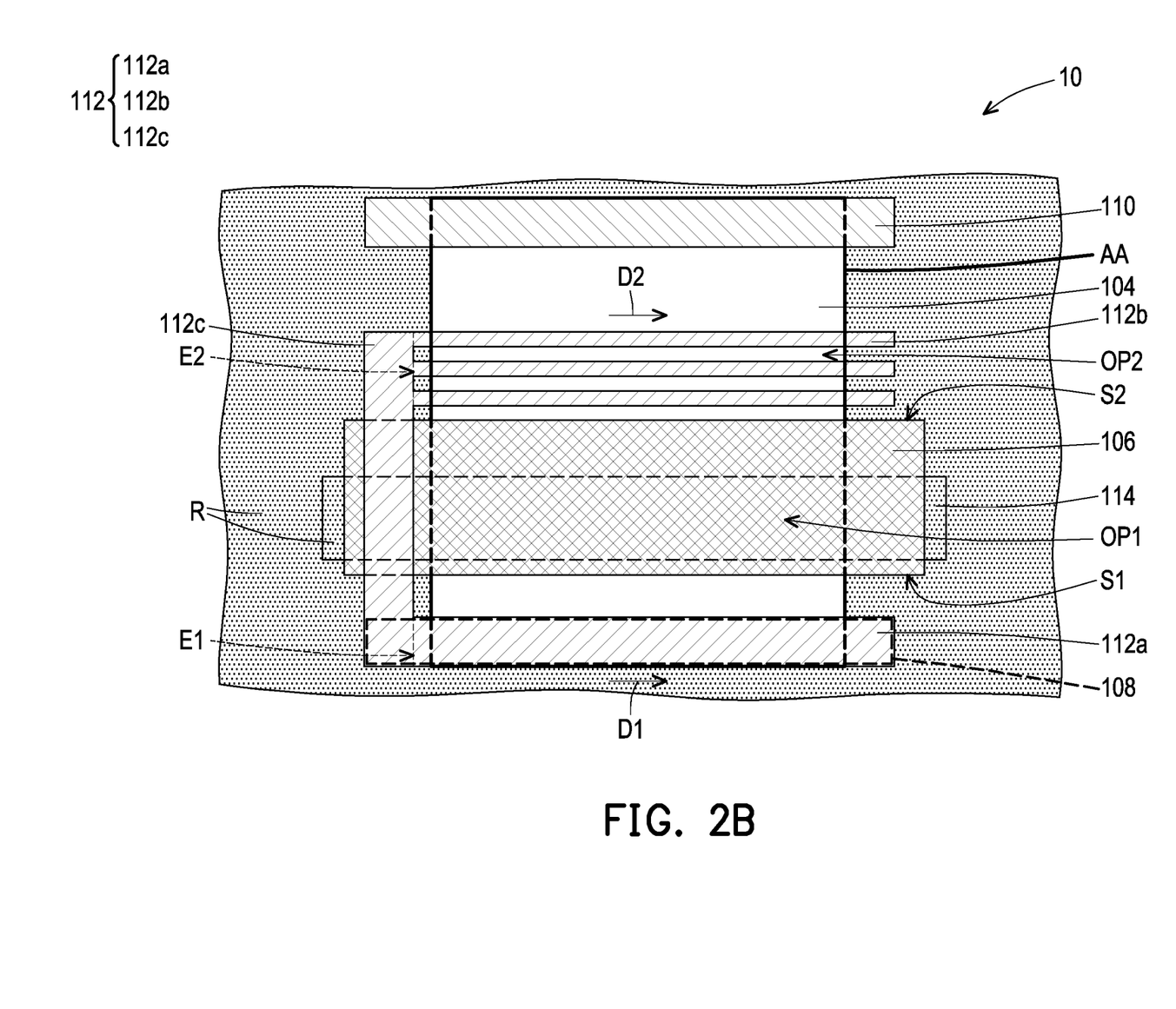
Figure 2C:
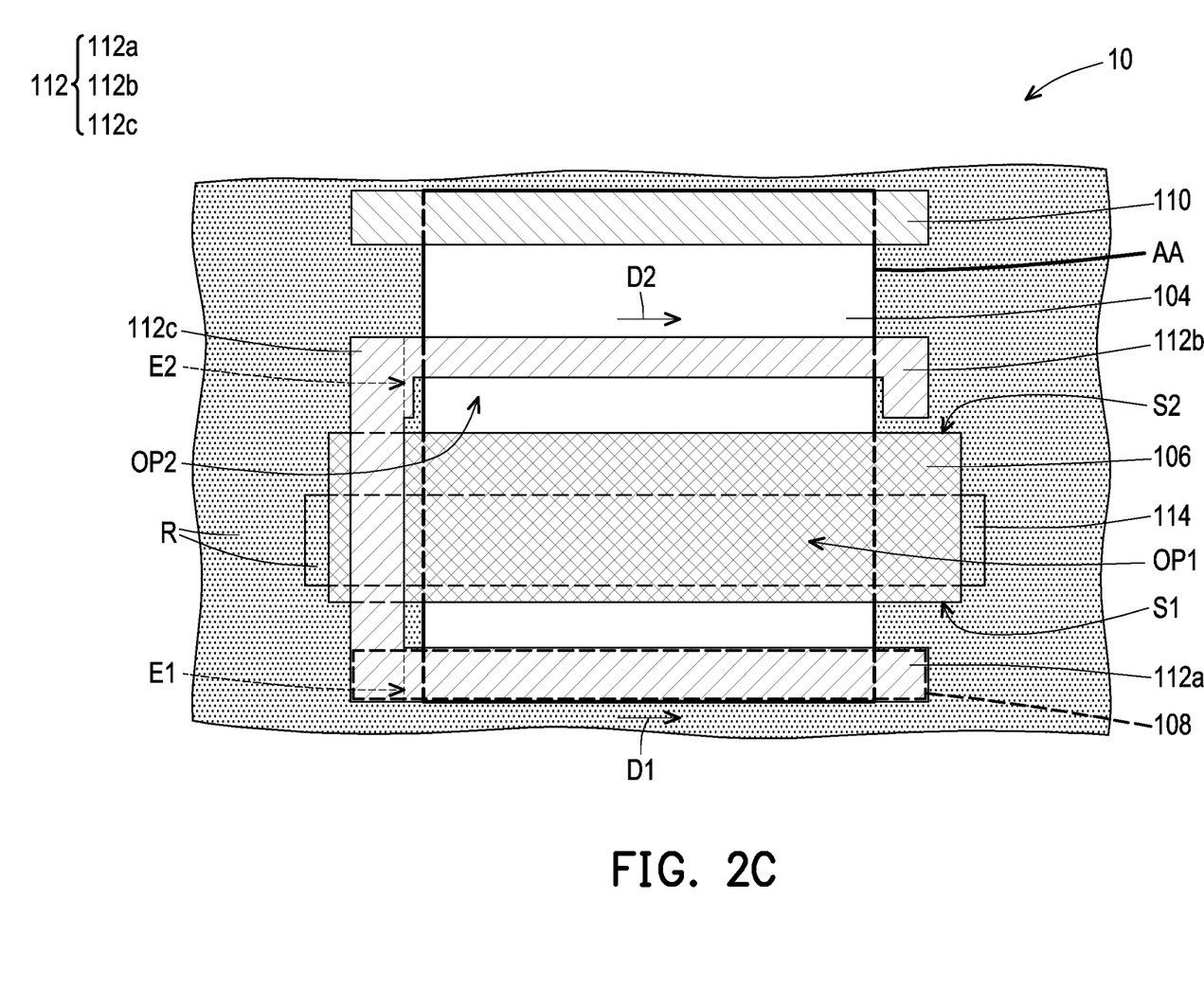
Figure 2D:
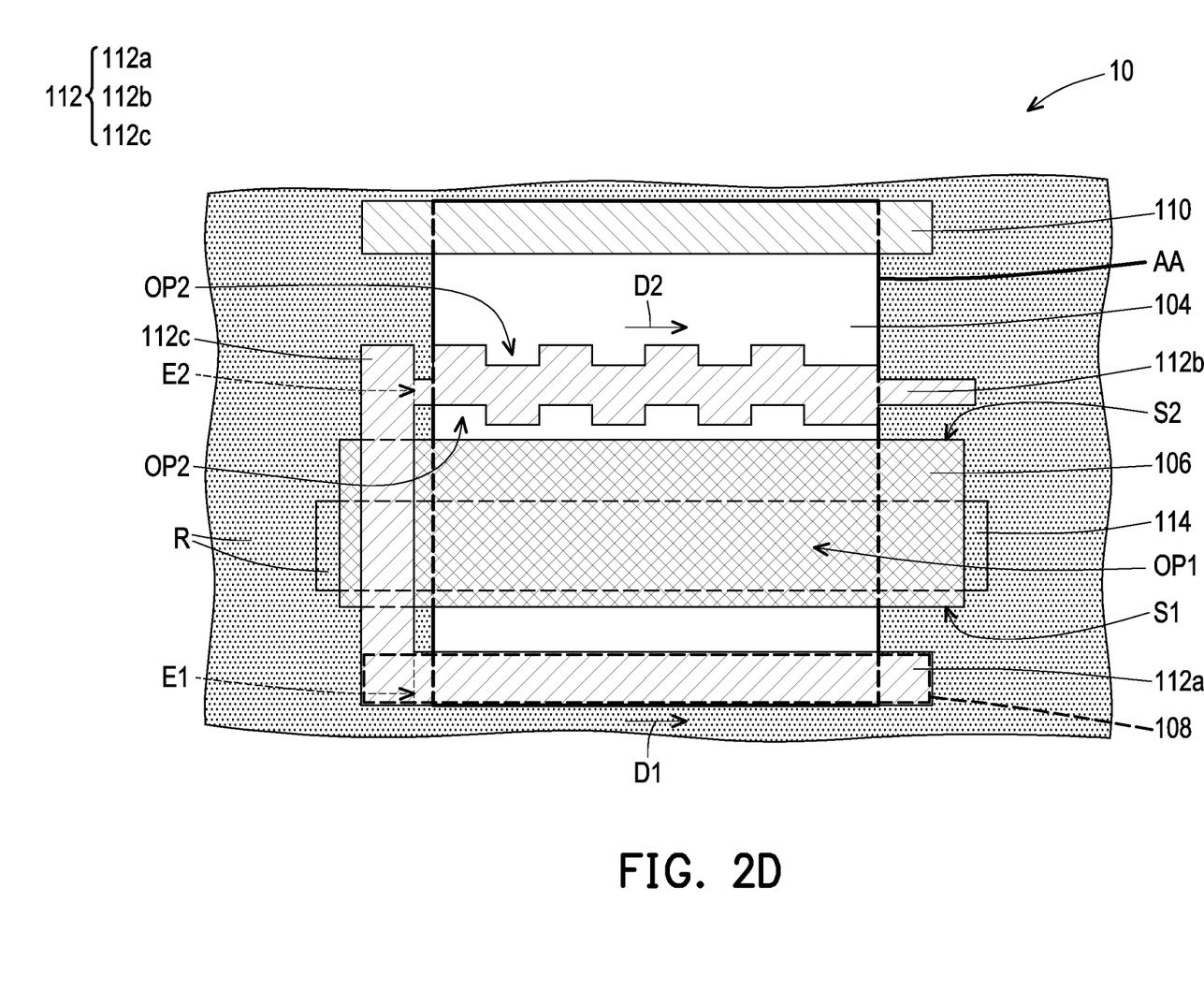

FIG. 1A is a top view illustrating a HEMT device according to some embodiments of the invention. FIG. 1B is a cross-sectional view taken along section line I-I' in FIG. 1A. FIG. 1C is a cross-sectional view taken along section line II-II' in FIG. 1A. FIG. 2A to FIG. 2D are top views illustrating a HEMT device according to other embodiments of the invention. In the top view of the present embodiment, some components in the cross-sectional view are omitted to clearly illustrate the configuration relationship between the components in the top view.

Referring to FIG. 1A to FIG. 1C, a HEMT device 10 includes a substrate 100, a channel layer 102, a barrier layer 104, a gate electrode 106, a source electrode 108, a drain electrode 110, and a source field plate 112. In some embodiments, the HEMT device 10 may be an enhancement-mode (E-mode) HEMT device or a depletion-mode (D-mode) HEMT device. In the present embodiment, the HEMT device 10 is, for example, an E-mode HEMT, but the invention is not limited thereto. That is, in the present embodiment, the HEMT device 10 may further include a P-type GaN layer 114. The p-type GaN layer 114 is located between the gate electrode 106 and the barrier layer 104. In other embodiments, when the HEMT 10 is a D-mode HEMT device, the HEMT 10 may not include the P-type GaN layer 114. The substrate 100 is, for example, a silicon substrate.

In some embodiments, as shown in FIG. 1A, an isolation region R may define an active region AA. In some embodiments, the isolation region R may be a doped region. In some embodiments, as shown in FIG. 1C, the depth of the isolation region R may reach the channel layer 102. That is, the isolation region R may be located in a portion of the P-type GaN layer 114, a portion of the barrier layer 104, and a portion of the channel layer 102.

Referring to FIG. 1B and FIG. 1C, the channel layer 102 is located on the substrate 100. The material of the channel layer 102 is, for example, gallium nitride (GaN). The barrier layer 104 is located on the channel layer 102. The material of the barrier layer 104 is, for example, aluminum gallium nitride (AlGaN). In addition, the HEMT device 10 may further include a buffer layer 116 and a nucleation layer 118. The buffer layer 116 is located between the channel layer 102 and the substrate 100. The material of the buffer layer 116 is, for example, aluminum gallium nitride or aluminum nitride (AlN). The nucleation layer 118 is located between the buffer layer 116 and the substrate 100. The material of the nucleation layer 108 is, for example, aluminum nitride.

Referring to FIG. 1A to FIG. 1C, the gate electrode 106 is located on the barrier layer 104 and has a first side S1 and a second side S2 opposite to each other. In the present embodiment, the gate electrode 106 may be located on the P-type GaN layer 114. In some embodiments, as shown in FIG. 1B and FIG. 1C, the top surface of the gate electrode 106 may have two protrusion portions PP. The gate electrode 106 may be located on the active region AA, and the gate electrode 106 may be further located on the isolation region R. The material of the gate electrode 106 is, for example, aluminum copper alloy (AlCu), aluminum, titanium nitride (TiN), or tungsten.

Referring to FIG. 1A to FIG. 1C, the source electrode 108 is located on the first side S1 of the gate electrode 106. In some embodiments, the source electrode 108 may be connected to channel layer 102. The source electrode 108 may be located on the active region AA, and the source electrode 108 may be further located on the isolation region R. The material of the source electrode 108 is, for example, aluminum copper alloy, aluminum, titanium nitride, or tungsten. The drain electrode 110 is located on the second side S2 of the gate electrode 106. In some embodiments, the drain electrode 110 may be connected to channel layer 102. The drain electrode 110 may be located on the active region AA, and the drain electrode 110 may be further located on the isolation region R. The material of the drain electrode 110 is, for example, aluminum copper alloy, aluminum, titanium nitride, or tungsten.

Referring to FIG. 1A to FIG. 1C, the source field plate 112 is connected to the source electrode 108. The source field plate 112 may be located on the active region AA, and the source field plate 112 may be further located on the isolation region R. In some embodiments, the source field plate 112 and the source electrode 108 may be integrally formed, that is, the source field plate 112 and the source electrode 108 may be formed simultaneously by the same process. In some embodiments, the source field plate 112 and the source electrode 108 may be independent components, that is, the source field plate 112 and the source electrode 108 may be independently formed by different processes. The material of the source field plate 112 is, for example, aluminum copper alloy, aluminum, titanium nitride, or tungsten.

Referring to FIG. 1A to FIG. 1C, the source field plate 112 includes a field plate portion 112a, a field plate portion 112b, and a field plate portion 112c. The field plate portion 112a is connected to the source electrode 108 and is located on the first side S1 of the gate electrode 106. In some embodiments, as shown in FIG. 1A, the top-view pattern of the field plate portion 112a may not overlap the top-view pattern of the gate electrode 106. The field plate portion 112a may extend in a direction D1 away from the field plate portion 112c. The field plate portion 112b is located on the second side S2 of the gate electrode 106. In some embodiments, as shown in FIG. 1A, the top-view pattern of the field plate portion 112b may not overlap the top-view pattern of the gate electrode 106. The plate portion 112b may extend in a direction D2 away from the field plate portion 112c.

Referring to FIG. 1A, the field plate portion 112c is connected to the end E1 of the field plate portion 112a and the end E2 of the field plate portion 112b. Furthermore, the field plate portion 112c may be connected to the source electrode 108. In some embodiments, the field plate portion 112c may be located on the same side of the field plate portion 112a and the field plate portion 112b. In some embodiments, as shown in FIG. 1C, the bottom surface of the field plate portion 112c may have two recess portions RP corresponding to the two protrusion portions PP.

Referring to FIG. 1A, the source field plate 112 has an opening OP1 located directly above the gate electrode 106, thereby reducing the overlapping area of the source field plate 112 and the gate electrode 106 and the parasitic capacitance between the source field plate 112 and the gate electrode 106. The opening OP1 is located between the field plate portion 112a and the field plate portion 112b. In the present embodiment, the top-view pattern of the field plate portion 112c overlaps the top-view pattern portion of the gate electrode 106, but the invention is not limited thereto.

In the present embodiment, as shown in FIG. 1A, the field plate portion 112b may not have an opening, but the invention is not limited thereto. In other embodiments, as shown in FIG. 2A to FIG. 2D, the field plate portion 112b may have at least one opening OP2, thereby further reducing the parasitic capacitance between the source field plate 112 and the drain electrode 110 and/or the parasitic capacitance between the source field plate 112 and gate electrode 106.

Referring to FIG. 1B and FIG. 1C, the HEMT device 10 may further include a passivation layer 120. The passivation layer 120 is located between the gate electrode 106 and the barrier layer 104. The material of the passivation layer 120 is, for example, silicon oxide or silicon nitride. In addition, the HEMT device 10 may further include a passivation layer 122. The passivation layer 122 is located between the source field plate 112 and the gate electrode 106. The material of the passivation layer 122 is, for example, silicon oxide or silicon nitride. Moreover, the HEMT device 10 may further include a dielectric layer 124. The dielectric layer 124 is located on the source field plate 112, the passivation layer 122, and the drain electrode 110. The dielectric layer 124 may be a single-layer structure or a multilayer structure. The material of the dielectric layer 124 is, for example, silicon oxide, silicon nitride, or a combination thereof.

Based on the above embodiments, in the HEMT device 10, the source field plate 112 includes the field plate portion 112a, the field plate portion 112b, and the field plate portion 112c, and the field plate portion 112c is connected to the end E1 of the field plate portion 112a and the end E2 of the field plate portion 112b. In addition, the source field plate 112 has the opening OP1 located directly above the gate electrode 106, and the opening OP1 is located between the field plate portion 112a and the field plate portion 112b. Therefore, the overlapping area of the source field plate 112 and the gate electrode 106 can be reduced to reduce the parasitic capacitance between the source field plate 112 and the gate electrode 106, thereby reducing power loss and improving device speed.

Figure 3A:
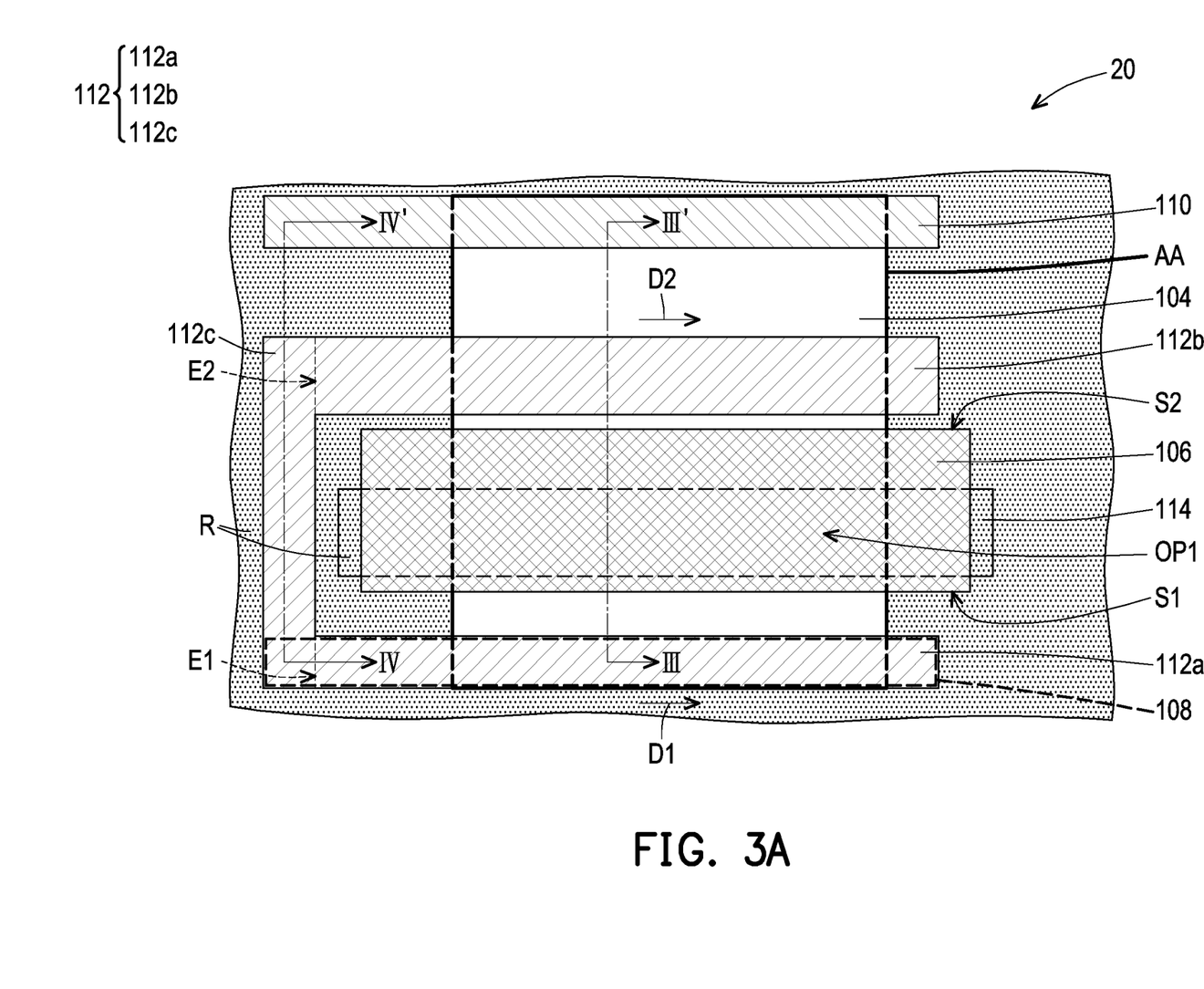
FIG. 3A is a top view illustrating a HEMT device according to other embodiments of the invention.
Figure 3B:
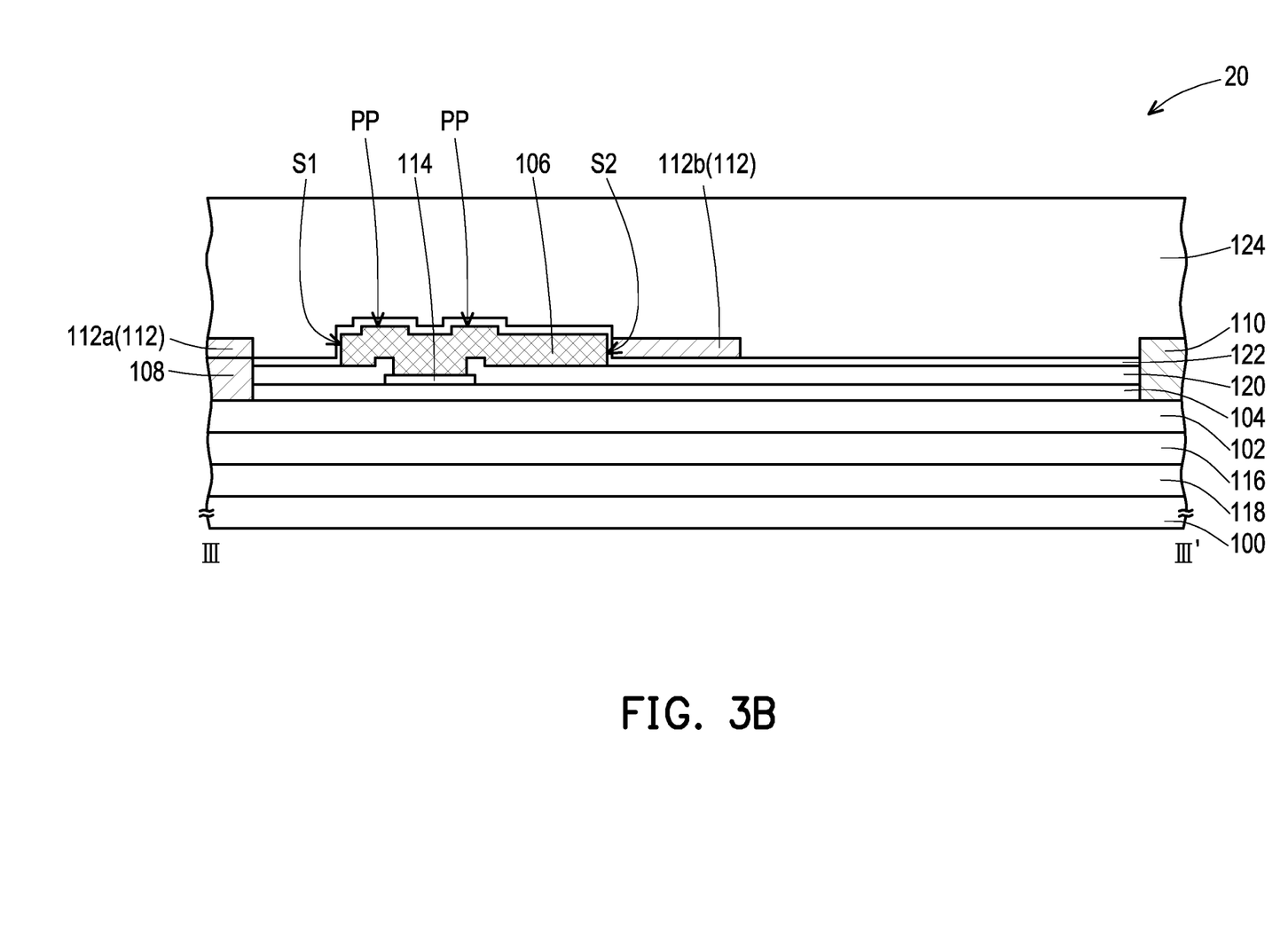
FIG. 3B is a cross-sectional view taken along section line III-III' in FIG. 3A.
Figure 3C:
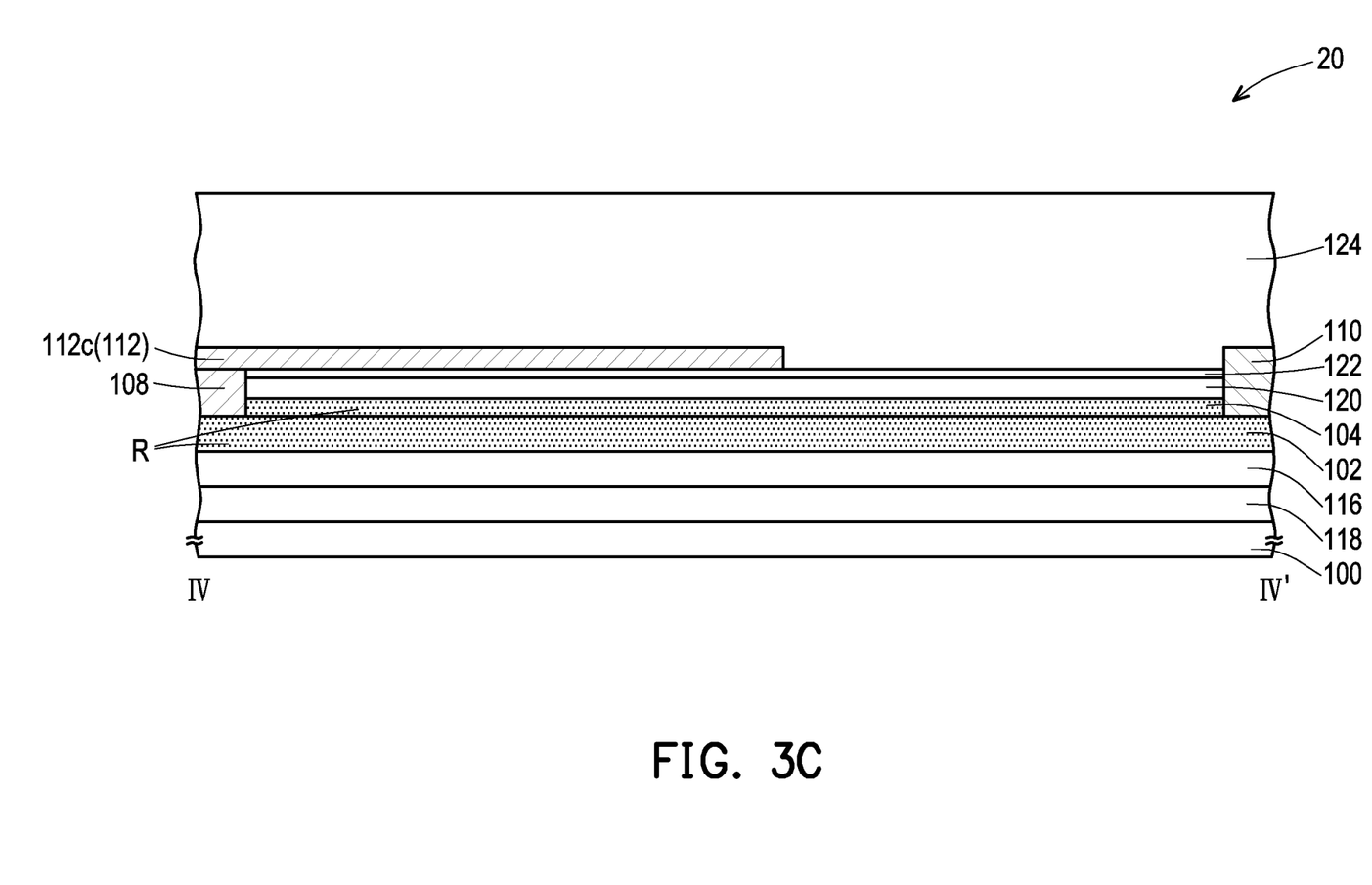
FIG. 3C is a cross-sectional view taken along section line IV-IV' in FIG. 3A.
Figure 4A:
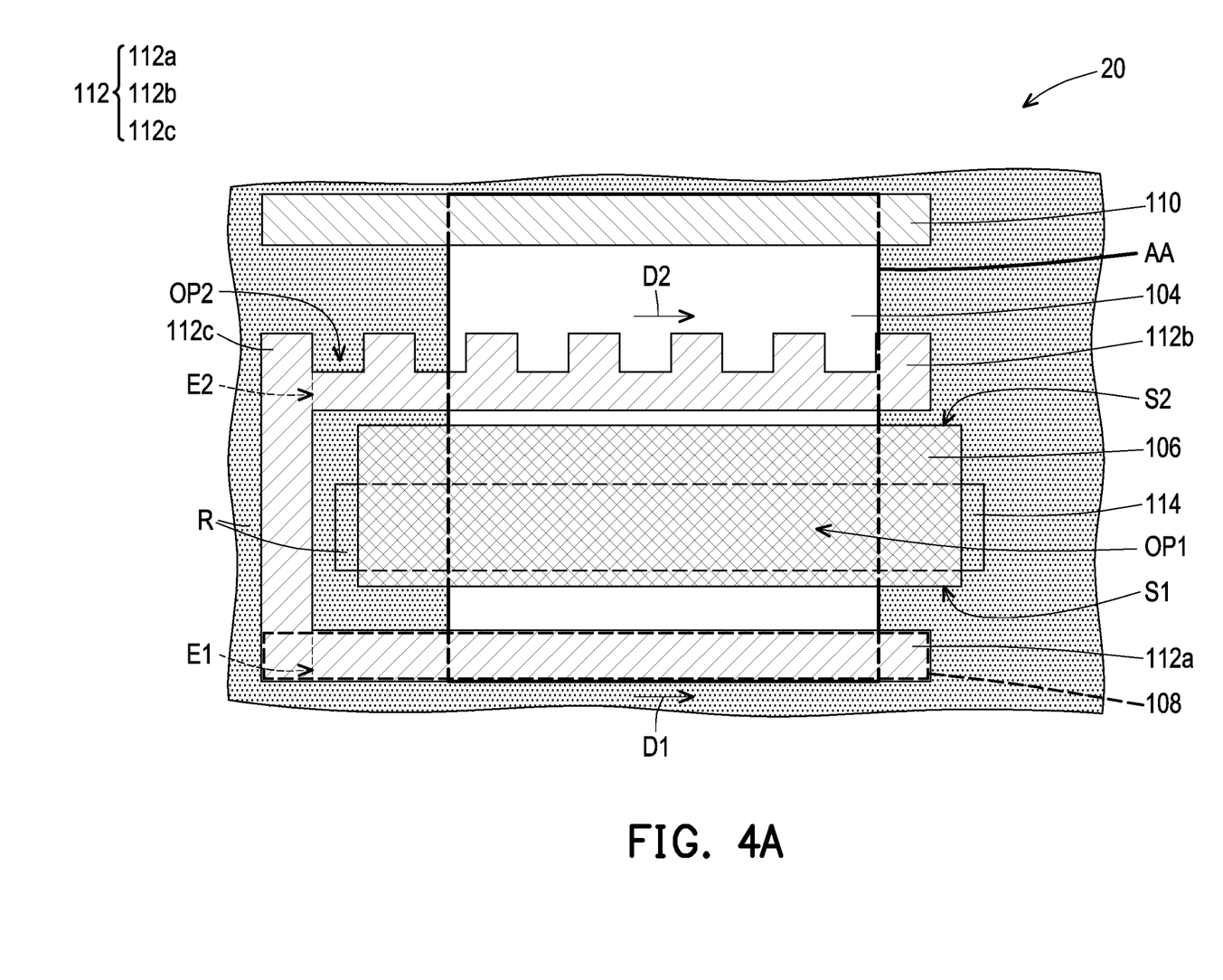
FIG. 4A to FIG. 4D are top views illustrating a HEMT device according to other embodiments of the invention.
Figure 4B:
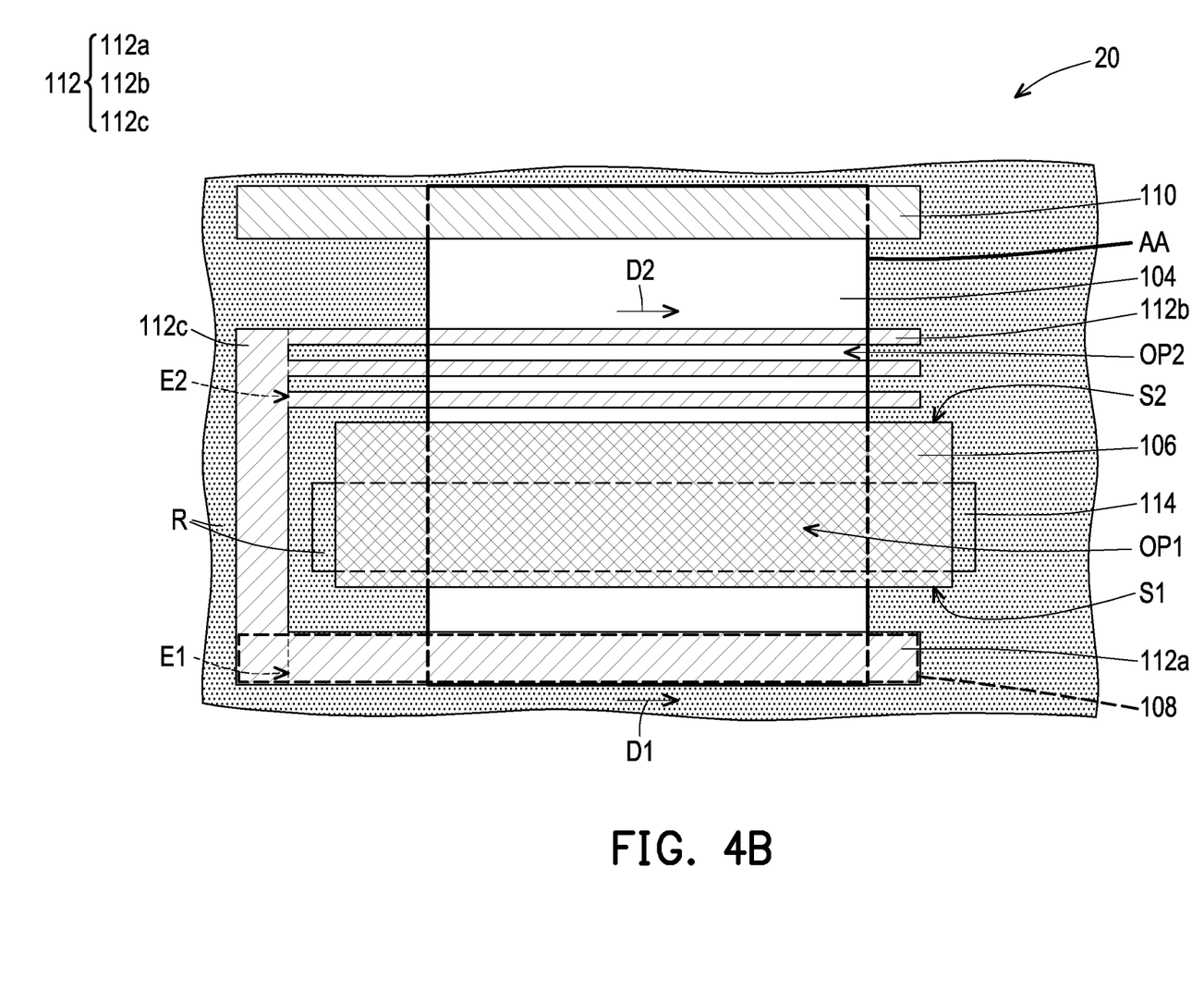
Figure 4C:
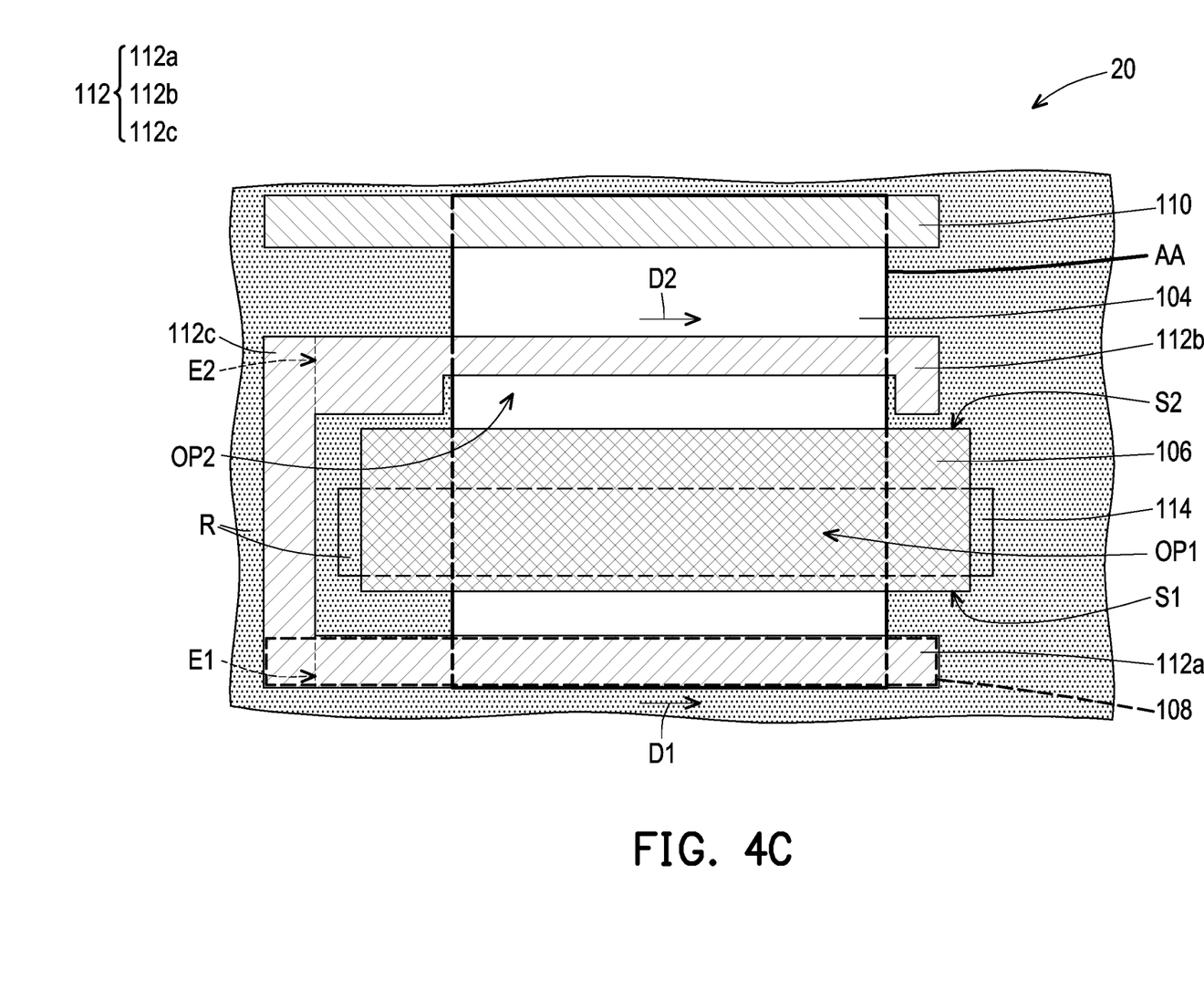
Figure 4D:
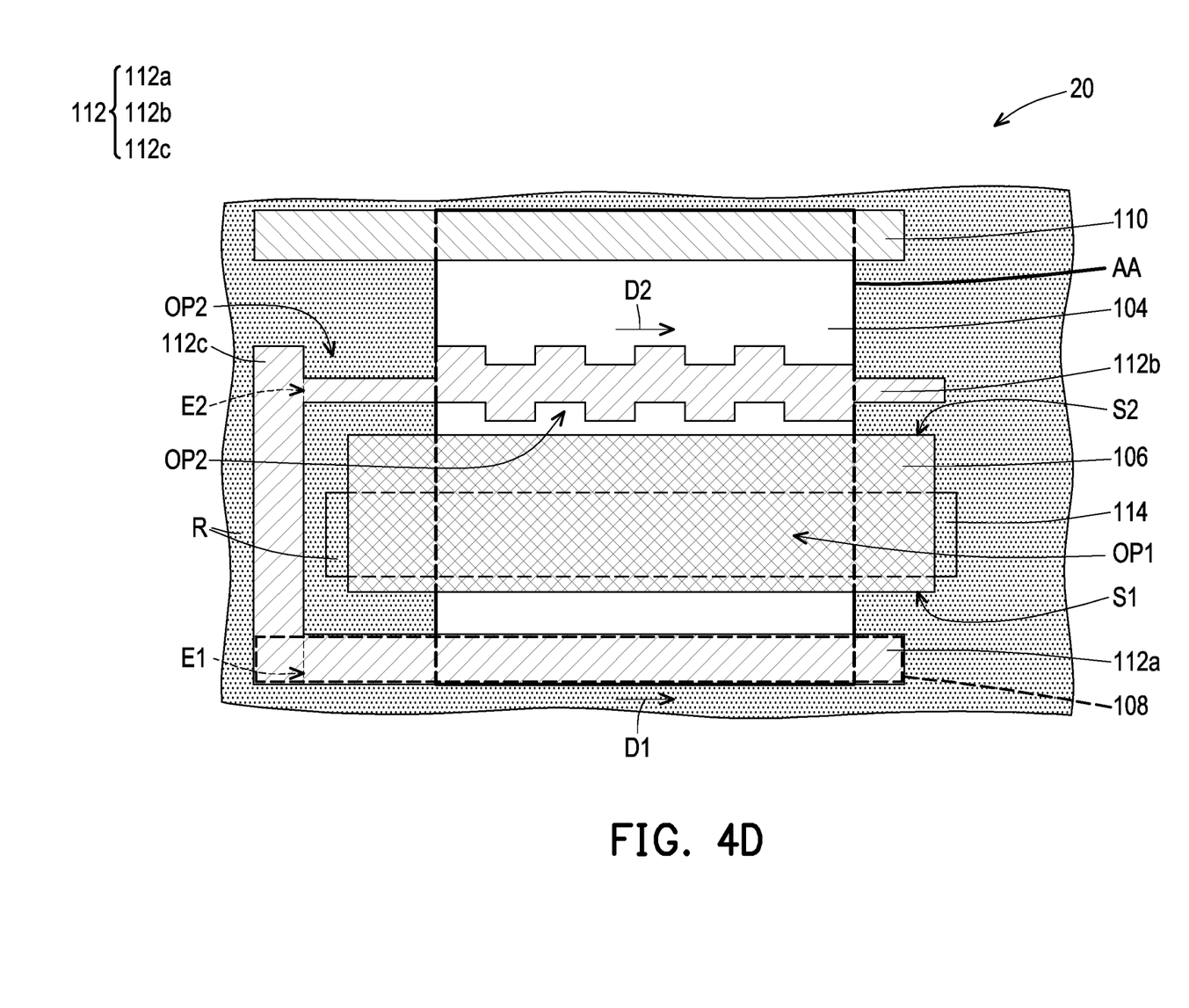

FIG. 3A is a top view illustrating a HEMT device according to other embodiments of the invention. FIG. 3B is a cross-sectional view taken along section line III-III' in FIG. 3A. FIG. 3C is a cross-sectional view taken along section line IV-IV' in FIG. 3A. FIG. 4A to FIG. 4D are top views illustrating a HEMT device according to other embodiments of the invention. In the top view of the present embodiment, some components in the cross-sectional view are omitted to clearly illustrate the configuration relationship between the components in the top view.

Referring to FIG. 1A to FIG. 1C and FIG. 3A to FIG. 3C, the difference between a HEMT device 20 of FIG. 3A to FIG. 3C and the HEMT device 10 of FIG. 1A to FIG. 1C is as follows. Referring to FIG. 3A, the top-view pattern of the field plate portion 112c does not overlap the top-view pattern of the gate electrode 106, thereby further reducing the overlapping area of the source field plate 112 and the gate electrode 106 and the parasitic capacitance between the source field plate 112 and the gate electrode 106. Furthermore, as shown in FIG. 3C, the bottom surface of the field plate portion 112c does not have recess portions corresponding to the two protrusion portions PP. In the present embodiment, as shown in FIG. 3A, the field plate portion 112b may not have an opening, but the invention is not limited thereto. In other embodiments, as shown in FIG. 4A to FIG. 4D, the field plate portion 112b may have at least one opening OP2, thereby further reducing the parasitic capacitance between the source field plate 112 and the drain electrode 110 and/or the parasitic capacitance between the source field plate 112 and gate electrode 106.

In addition, the same or similar components in the HEMT device 20 and the HEMT device 10 are denoted by the same reference symbols, the same or similar content in the HEMT device 20 and the HEMT device 10 may be referred to the description of the HEMT device 10 in the foregoing embodiment, and the description thereof is omitted.

In summary, the HEMT device of the aforementioned embodiments can reduce the overlapping area of the source field plate and the gate electrode, so as to reduce the parasitic capacitance between the source field plate and the gate electrode, thereby reducing power loss and improving device speed.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A high electron mobility transistor (HEMT) device, comprising:
    a substrate;
    a channel layer located on the substrate;
    a barrier layer located on the channel layer;
    a gate electrode located on the barrier layer and having a first side and a second side opposite to each other;
    a source electrode located on the first side of the gate electrode;
    a drain electrode located on the second side of the gate electrode; and
    a source field plate connected to the source electrode and comprising:
        a first field plate portion connected to the source electrode and located on the first side of the gate electrode;
        a second field plate portion located on the second side of the gate electrode; and
        a third field plate portion connected to an end of the first field plate portion and an end of the second field plate portion, wherein
        the source field plate has a first opening located directly above the gate electrode,
        the first opening is located between the first field plate portion and the second field plate portion, and
        a top-view pattern of the third field plate portion partially overlaps a top-view pattern of the gate electrode.

2. The HEMT device according to claim 1, wherein a top-view pattern of the first field plate portion does not overlap the top-view pattern of the gate electrode.

3. The HEMT device according to claim 1, wherein a top-view pattern of the second field plate portion does not overlap the top-view pattern of the gate electrode.

4. The HEMT device according to claim 1, wherein the first field plate portion extends in a first direction away from the third field plate portion, and the second field plate portion extends in a second direction away from the third field plate portion.

5. The HEMT device according to claim 1, wherein the second field plate portion has at least one second opening.

6. The HEMT device according to claim 1, wherein a top surface of the gate electrode has two protrusion portions.

7. The HEMT device according to claim 6, wherein a bottom surface of the third field plate portion has two recess portions corresponding to the two protrusion portions.

8. The HEMT device according to claim 1, further comprising:
    a passivation layer located between the source field plate and the gate electrode.

9. The HEMT device according to claim 1, further comprising:
    a buffer layer located between the channel layer and the substrate; and
    a nucleation layer located between the buffer layer and the substrate.

10. The HEMT device according to claim 1, further comprising:
    a p-type GaN layer located between the gate electrode and the barrier layer.

11. A HEMT device, comprising:
    a substrate;
    a channel layer located on the substrate;
    a barrier layer located on the channel layer;
    a gate electrode located on the barrier layer and having a first side and a second side opposite to each other;
    a source electrode located on the first side of the gate electrode;
    a drain electrode located on the second side of the gate electrode; and
    a source field plate connected to the source electrode and comprising:
        a first field plate portion connected to the source electrode and located on the first side of the gate electrode;
        a second field plate portion located on the second side of the gate electrode; and
        a third field plate portion connected to an end of the first field plate portion and an end of the second field plate portion, wherein
        the source field plate has a first opening located directly above the gate electrode,
        the first opening is located between the first field plate portion and the second field plate portion, and
        a top-view pattern of the third field plate portion does not overlap a top-view pattern of the gate electrode, wherein
        a top surface of the gate electrode has two protrusion portions.

12. The HEMT device according to claim 11, wherein a top-view pattern of the first field plate portion does not overlap the top-view pattern of the gate electrode.

13. The HEMT device according to claim 11, wherein a top-view pattern of the second field plate portion does not overlap the top-view pattern of the gate electrode.

14. The HEMT device according to claim 11, wherein the first field plate portion extends in a first direction away from the third field plate portion, and the second field plate portion extends in a second direction away from the third field plate portion.

15. The HEMT device according to claim 11, wherein the second field plate portion has at least one second opening.

16. The HEMT device according to claim 11, wherein a bottom surface of the third field plate portion has two recess portions corresponding to the two protrusion portions.

17. The HEMT device according to claim 11, further comprising:
    a passivation layer located between the source field plate and the gate electrode.

18. The HEMT device according to claim 11, further comprising:
    a buffer layer located between the channel layer and the substrate; and a nucleation layer located between the buffer layer and the substrate.

19. The HEMT device according to claim 11, further comprising:
    a p-type GaN layer located between the gate electrode and the barrier layer.

* * * * *